United States Patent

[11] 3,626,408

[72] Inventor Robert L. Carbrey
Boulder, Colo.

[21] Appl. No. 889,399
[22] Filed Dec. 31, 1969
[45] Patented Dec. 7, 1971

[73] Assignee Bell Telephone Laboratories, Incorporated
Murray Hill, N.J.

[54] LINEAR CHARGE REDISTRIBUTION PCM CODER AND DECODER
6 Claims, 20 Drawing Figs.

[52] U.S. Cl. .......... 340/347 AD, 340/347 DA
[51] Int. Cl. .......... H03k 13/02
[50] Field of Search .......... 340/347; 320/1; 328/151; 332/11

[56] References Cited

UNITED STATES PATENTS

| | | | |
|---|---|---|---|
| 3,251,052 | 5/1966 | Hoffman et al. .......... | 340/347 |
| 3,449,741 | 6/1969 | Egerton, Jr. .......... | 340/347 |
| 3,462,759 | 8/1969 | Hoffman .......... | 340/347 |
| 3,475,748 | 10/1969 | Price et al. .......... | 340/347 |

*Primary Examiner*—Maynard R. Wilbur
*Assistant Examiner*—Charles D. Miller
*Attorneys*—R. J. Guenther and E. W. Adams, Jr.

ABSTRACT: Circulating pulse code modulation (PCM) encoder and decoder which utilize capacitive charge redistribution techniques. A means for automatic scaling to adapt reference voltages to the signal to be converted is also provided.

SWITCH 4 CONTROL

REDISTRIBUTION
CONTROL

VOLTAGE
STORED
ACROSS
CAPACITOR 1

VOLTAGE
STORED
ACROSS
CAPACITOR 2

INVENTOR
R. L. CARBREY
BY David P. Kelley
ATTORNEY

LINEAR CHARGE REDISTRIBUTION PCM CODER AND DECODER

BACKGROUND OF THE INVENTION

This invention relates to digital transmission systems. In particular, it relates to the linear conversion of analog signals and pulse code modulation signals, one to the other.

In pulse code modulation (PCM), selected combinations of discrete levels, known as quantum levels, are assigned to each of the analog signal samples to be encoded. That is, in the amplitude range within which the analog signal samples may fall, certain discrete levels which are multiples of the basic quantum are chosen. We call these discrete levels quantum levels. Then, in the encoding procedure, certain of these quantum levels are assigned to the signal sample such that, when they are added together, they yield an approximation of the sample. The encoded sample, therefore, is a PCM word which consists of binary ones and zeroes. Each digit of the word corresponds to a different quantum level; a one may represent the presence of that particular quantum level in the approximated sample, while a zero may represent its absence. To convert the PCM word back to an analog signal, the quantum levels which are designated by ones are merely added together to give an approximation of the original analog signal sample. Sampling techniques are then used to recover the analog signal from the sample.

One type of encoding scheme in general use is the sequential circulating type. Circulating coders typically operate by means of a series of periodic decisions and subsequent internal adjustments. The decisions usually involve comparison of a cumulative sample approximation with some datum level which may be the analog sample voltage or some predetermined datum voltage. The subsequent internal adjustments may involve stored voltages or switched circuit elements.

One class of circulating PCM encoders employs a voltage source which generates series of discrete levels which serve as quantum levels. For example, one large group in this class uses the decaying oscillations of an excited RC tank circuit as a quantum level generator. The positive and negative oscillations are sequentially added to or subtracted from the analog sample approximation and subsequent decisions are made as to whether that particular quantum level should be included or excluded from the encoded sample.

The present invention overcomes many of the disadvantages inherent in the foregoing prior art circulating-type encoders. Foremost, the network used to generate the quantum levels in the present invention is a capacitive redistributing pair. Thus, the quantum levels are more precise and consistent than the decaying oscillation type, for example, resulting in a significant improvement in encoding accuracy. In addition, since a plurality of generators is not used, the loop structure of the embodiment of the invention is considerably simpler than most of the other arrangements in its class, thereby resulting in further enhancement of encoding accuracy.

The present invention is a linear sequential encoder which utilizes a pair of redistributing capacitors for a quantum level generator. Under the control of half-period pulses, an accumulated approximation voltage is compared directly to the analog sample to be encoded, and appropriate voltage adjustments are subsequently made.

In an illustrative embodiment of the invention a pair of matched capacitors are alternately switched in parallel and to ground to obtain a stepwise decreasing voltage waveform the steps of which serve as quantum levels. The smallest quantum level corresponds to one quantum. These quantum levels are sequentially added to a prior state stored voltage and compared with the sample to be encoded. PCM signals which are indicative of this comparison are produced by the comparator, and the prior state stored voltage is subsequently readjusted. Automatic scaling apparatus is provided to continuously adjust reference voltages.

It is a feature of the present invention that capacitive stored voltages are utilized in a circulating encoder to obtain a linear PCM encoding characteristic. Automatic scaling provides an optimum match for the linear characteristic to the samples to be encoded. These and other features of the present invention will be more readily apparent from the following detailed description, taken in conjunction with the accompanying drawings.

DETAILED DESCRIPTION

Figure 1A:
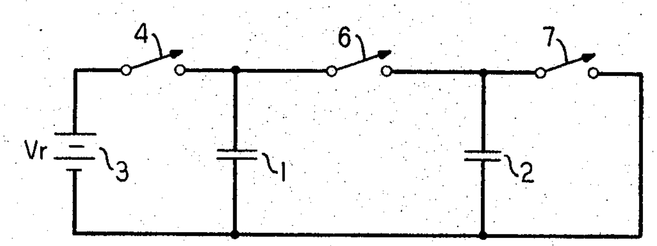
FIG. 1A PRIOR ART
FIGS. 1A through 1E show a two-capacitor redistributor and several appropriate voltage waveforms.
Figure 1B:
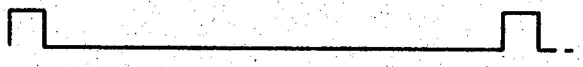
Figure 1C:
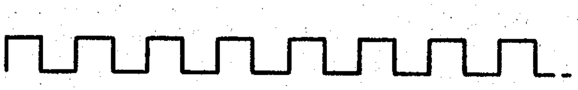
Figure 1D:
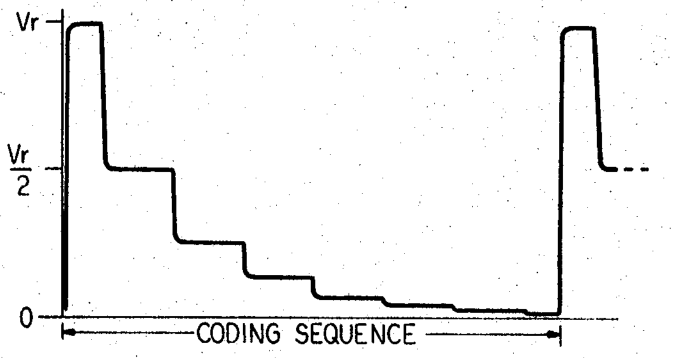
Figure 1E:
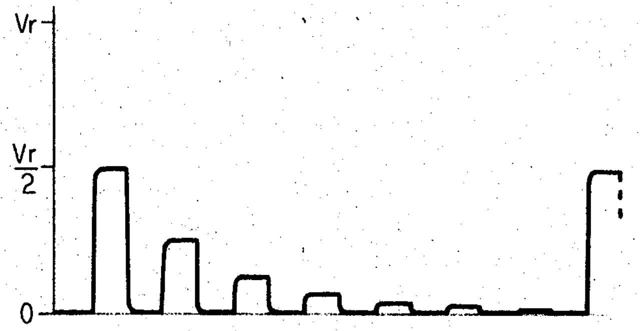

We turn first to FIG. 1, which shows the capacitive redistribution network which serves as a quantum level generator for the converters which operate according to the principles of the invention. As is shown in FIG. 1A, the generator comprises two matched capacitors, 1 and 2, connected in parallel and to ground by switches 6 and 7 and, by means of a switch 4, to some reference voltage source 3, designated as $V_r$. At the beginning of each coding sequence, switch 6 is opened and switches 4 and 7 are closed. Capacitor 1 is thus charged to $V_r$ and capacitor 2 is discharged. Switch 4, which operates under the control of the pulse waveform of FIG. 1B, is then opened and remains so for the rest of the redistributing sequence. Complementary switches 6 and 7 are controlled by the pulse waveform of FIG. 1C; upon the occurrence of each pulse, switch 6 is closed and switch 7 is opened. Thus, whenever a closure of switch 6 occurs, capacitors 1 and 2 are connected in parallel and charge is shared between them. If the capacitors are equal, the voltage on capacitor 1 is halved through the charge redistribution with capacitor 2. For each coding sequence, the waveforms shown in FIGS. 1D and 1E result. We may note that the voltage stored on capacitor 1 (FIG. 1D) is a staircase function in which each step is half the magnitude of the preceding step. Each step thus corresponds to a quantum level which is one-half the size of the previous quantum level. The voltage across capacitor 2 (FIG. 1E) is a series of pulses, each pulse being one-half the amplitude of the preceding pulse.

Figure 2A:
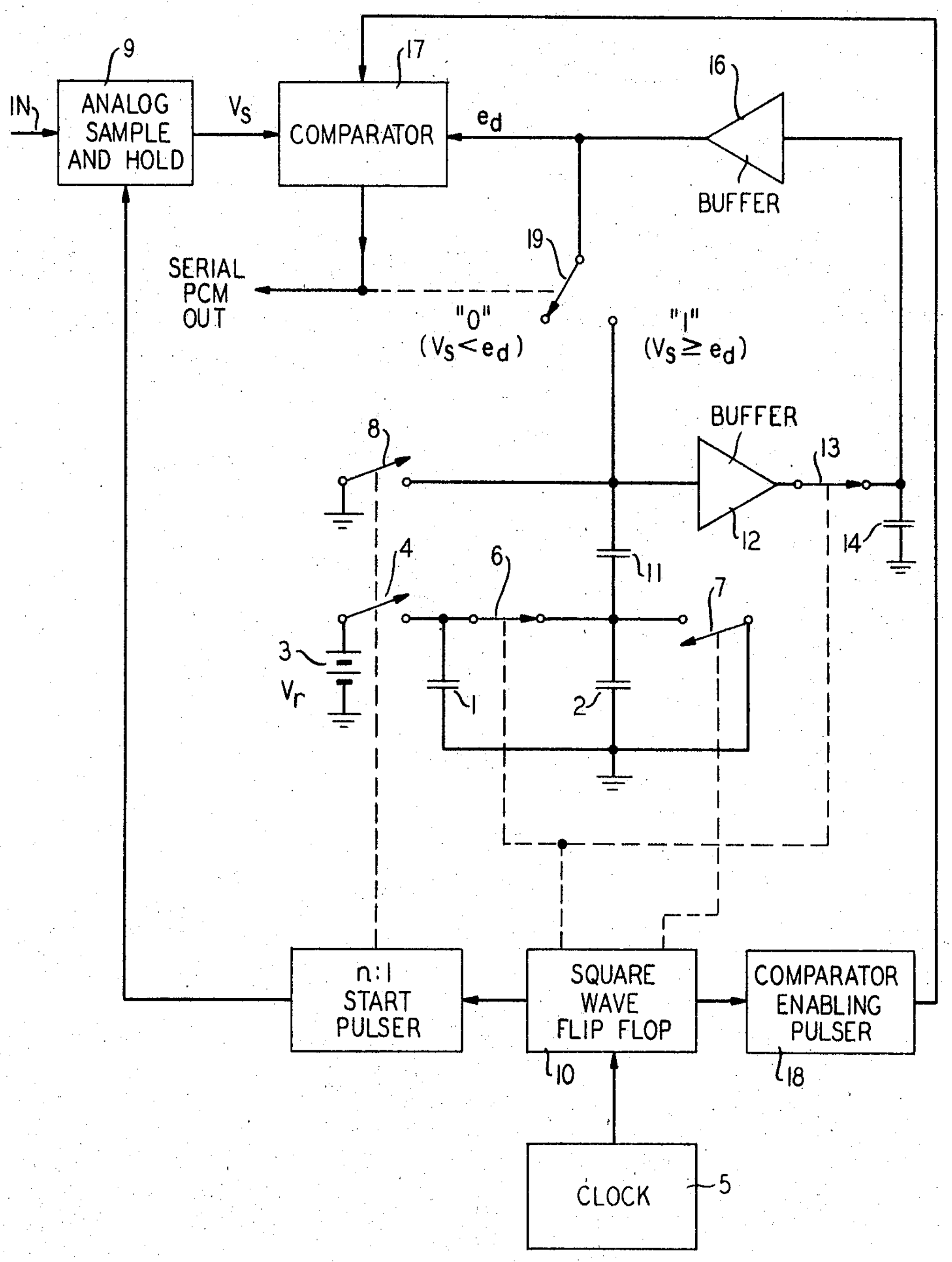
FIGS. 2A through 2H show a first illustrative embodiment of an analog to digital converter which utilizes the principles of the invention, and several pertinent voltage waveforms.

With this in mind, discussion of a first illustrative embodiment of an analog to digital converter which operates according to the principles of the invention is appropriate. FIG. 2A is a diagram of the converter and FIGS. 2B through 2H are voltage waveforms which apply to the operation of the converter. Capacitors 1 and 2, operating in conjunction with voltage source 3 and switches 4, 6, and 7, perform the function of a quantum level generator and operate in a manner identical to the redistributor of FIG. 1. The combination of capacitors 2 and 11 shown in FIG. 2A is known as a "bootstrapping" configuration. That is, as long as switches 8 and 19 are open and the buffer 12 (a buffer is some high-input impedance, low-output impedance, unity gain apparatus) does not disturb the charge on capacitor 11, the node above capacitor 11 will be "- bootstrapped," or forced to the voltage of the node between capacitors 2 and 11. Switches 4 and 8 operate under the control of the pulse waveform of FIG. 2C, and switches 6, 7 and 13 operate under the control of the clock pulses from the clock 5 through the square wave flip-flop 10 shown in FIG. 2B. Since switches 6 and 7 are complementary, whenever one is closed, the other is opened. $V_r$ may be chosen as the size of the maximum signal sample to be encoded.

The operation of the encoder proceeds as follows. At the beginning of each coding cycle, a different analog sample is taken by the analog sample and hold circuit 9. At this time, switches 4, 7, and 8 are closed and switches 6, 13, and 19 are opened. Thus capacitors 2 and 11 are discharged and capacitor 1 is charged to the reference voltage $V_r$. Switches 4 and 8 are then opened and remain so for the rest of the coding sequence. The first voltage redistribution takes place when switch 6 closes and switch 7 opens. Then, charge is shared between capacitors 1 and 2 and the voltage across the parallel combination settles to $V_r/2$. As was noted above, capacitor 11 is thereby bootstrapped to $V_r/2$, and, since switch 13 operates simultaneously with switch 6, capacitor 14 is also charged to $V_r/2$. The buffer 12, which has a high-input impedance and a low-output impedance, is necessary to provide a current source capable of charging capacitor 14 to the voltage of capacitor 11 without disturbing the charge on capacitor 11. Likewise, the buffer 16 provides a comparison voltage, $e_d$, which is equal to the voltage on capacitor 14, without disturbing the charge on capacitor 14. The comparator 17 operates under the control of the comparator enabling pulser 18, which in turn is controlled by the same timing which controls switch 7. Whenever the comparator enabling pulser 18 signals the comparator 17, the comparator 17 directly compares $e_d$ with the analog sample voltage $V_s$ and emits PCM output signals on the basis of this comparison. If $e_d$ is less than or equal to $V_s$, a pulse, representing a digital "1," is emitted; otherwise no pulse, or a digital "0" is emitted. Furthermore, switch 19 is controlled by the PCM output signal from the comparator 17. Whenever a "1" is emitted, switch 19 is closed to the "1" position; otherwise, it remains in the "0" position, as shown in FIG. 2A. If ever a closure of switch 19 occurs, it is during that portion of the timing cycle when switch 6 is open and switch 7 is closed. Thus, if $e_d$ is less than or equal to $V_s$, capacitor 11 is charged to $e_d$.

Then, during the next timing cycle, a new redistribution voltage, $V_r/4$, is placed on capacitor 2. The new "bootstrapped" voltage and therefore the new $e_d$ is then either $V_r/4$ or $3V_r/$, depending upon whether the previous $e_d$ had been stored on capacitor 11. Next, the new $e_d$ is compared to $V_s$. A digital signal is emitted and switch 19 is operated accordingly. Once more, if $e_d$ is less than $V_s$, switch 19 is closed and capacitor 11 is charged to the new, larger $e_d$. Otherwise, switch 19 remains open and the charge on capacitor 11 is unchanged (0 or $V_r/2$, from the previous step). The next redistribution then takes place and the bootstrapping, comparison, signal emission, and operation of switch 19 are repeated. This procedure continues as often as is necessary to obtain the desired encoding accuracy.

Figures 2B, 2C, 2D, 2E, 2F, 2G, 2H:
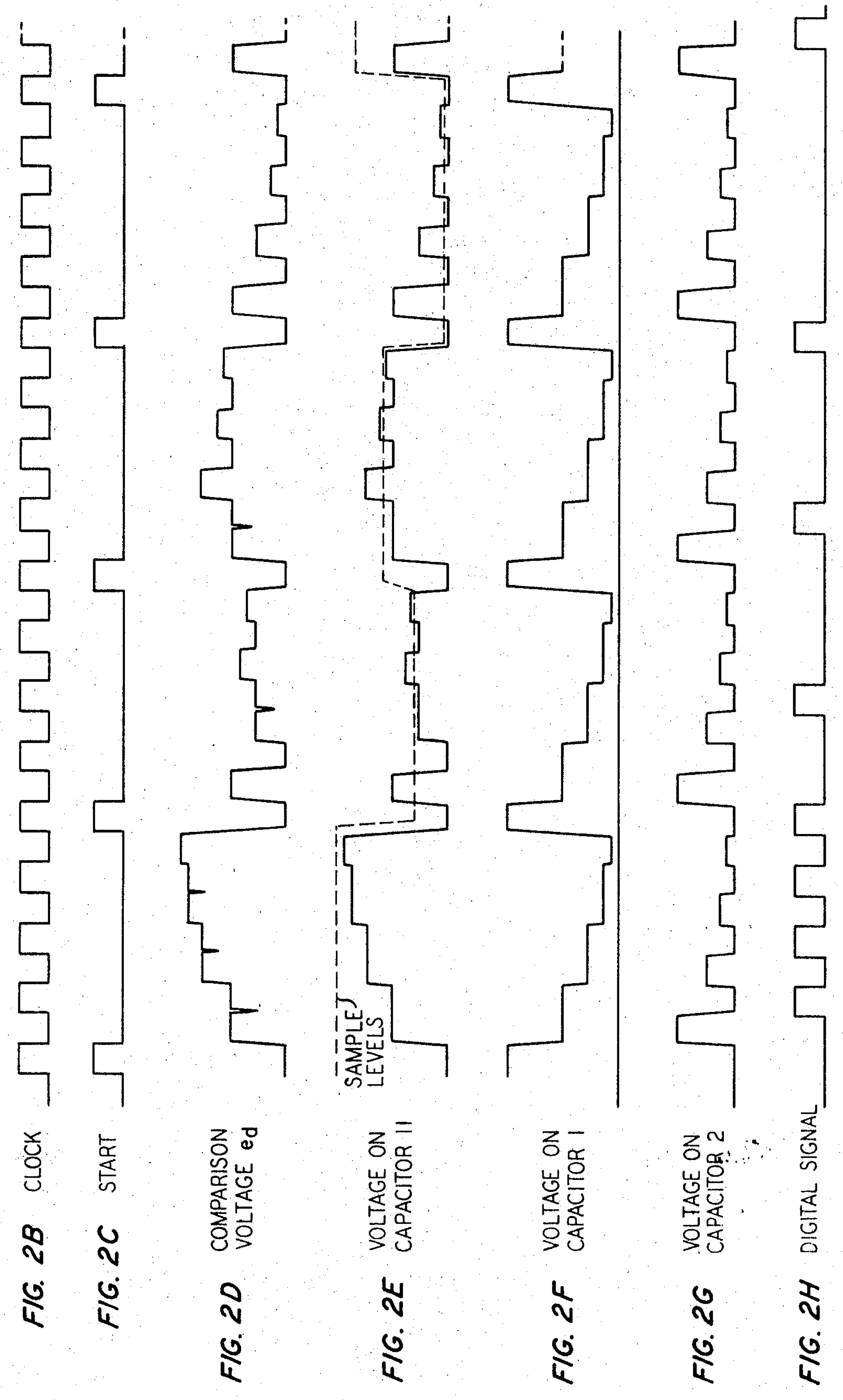

FIGS. 2B through 2H show voltage waveforms of this encoder for several sample levels. As was previously mentioned, FIG. 2C shows the start pulse waveform which controls switches 4 and 8 and FIG. 2B shows the clock waveform which controls switches 6, 7 and 13. The exponential staircase voltages of FIG. 2F represent the voltage across capacitor 1; each new staircase corresponds to the beginning of a new coding cycle. FIG. 2G shows the corresponding pulse waveform which appears across capacitor 2 as a result of charge redistribution with capacitor 1. FIG. 2D shows the bootstrapped voltage waveforms and FIG. 2E shows the corresponding $e_d$ voltages as well as the analog sample levels. If $e_d$ is less than the sample level, it is stored on capacitor 11 and if $e_d$ is greater than the sample level, the voltage on capacitor 11 remains at its previous level. FIG. 2H shows the PCM signal which is emitted from the comparator 17. Digital pulses, or ones, occur whenever the $e_d$ voltage in FIG. 2E is less than or equal to the sample level.

Figure 3:
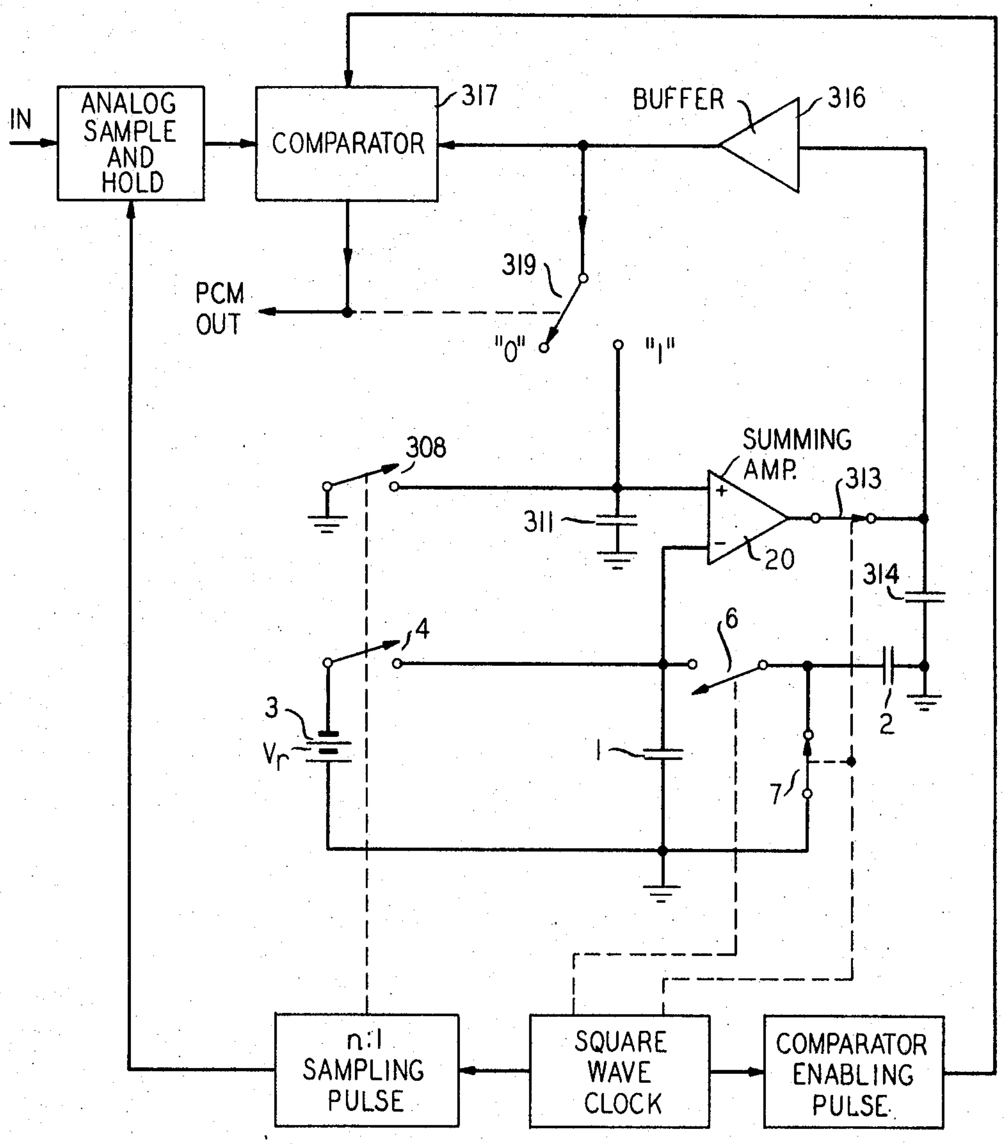
FIG. 3 shows a second illustrative embodiment of an encoder which utilizes the principles of the invention.

A second illustrative embodiment of an analog to digital converter which utilizes the principles of the invention is shown in FIG. 3. Two notable changes exist in the embodiment of FIG. 3. The first is the structure of the redistributor and the second is the method used for adding the prior state voltage to the redistribution voltage. Capacitors 1 and 2, in conjunction with switches 4, 6, and 7 and reference voltage source 3 still perform the redistribution function as they did in the generators of FIGS. 1 and 2. Herein, however, the redistribution voltage which is actually used for quantum levels is the voltage across capacitor 1 instead of capacitor 2. Thus, the magnitude of reference voltage source 3 only needs to be half as large as it was in the embodiment of FIG. 2. The timing of switches 4, 6, 7, 38, and 313 is identical to that of their analogs in the embodiment of FIG. 2. Similarly, the functioning of capacitor 314, buffer 316, comparator 317 and switch 319 is not changed. Buffer 12, however, is replaced with a dual-input summing amplifier 20, and prior state storage capacitor 311 is grounded. Summing amplifier 20 operates by merely adding the redistribution voltage across capacitor 1 to the prior state voltage stored on capacitor 311 and charging capacitor 314 to their sum. Thus, summing amplifier 20, in conjunction with capacitors 1 and 311, replaces the buffered bootstrapping arrangement of FIG. 2. It is noteworthy, however, that since the summing amplifier 20 is generally embodied as an operational amplifier, one of its input terminals is shown as an inverting terminal. Therefore, to enable proper operation with regard to polarity, reference voltage source 3 must be negative in polarity. But for these differences, the embodiment of FIG. 3 operates identically to the embodiment of FIG. 2.

Figure 4:
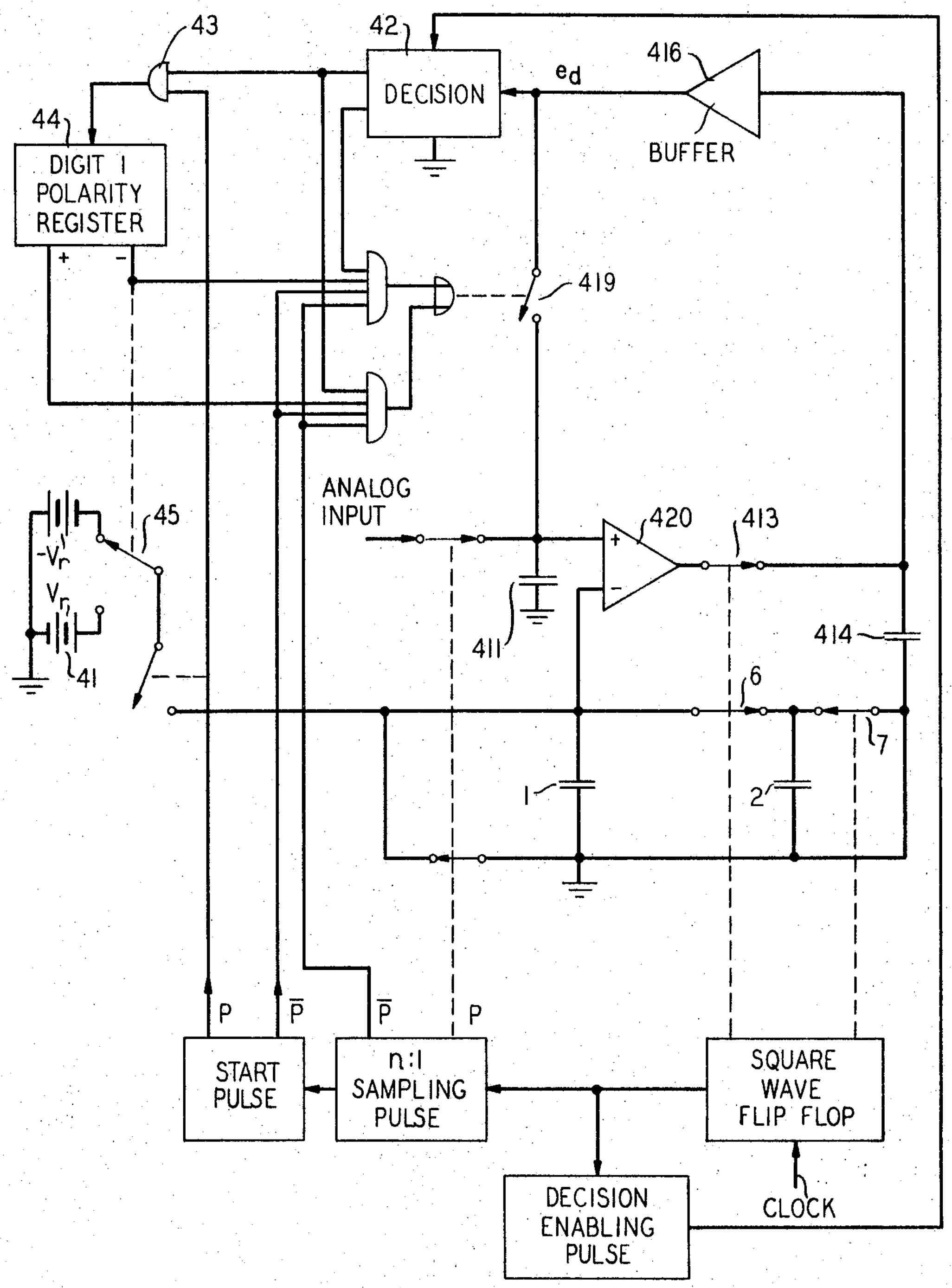
FIG. 4 shows a third illustrative embodiment of the encoder according to the invention.

The embodiments of FIGS. 2 and 3, as described, operated only for signals of positive polarity. They were described this way for the sake of simplicity only, and the addition of any of the apparatus commonly in use for adapting unipolar coders to bipolar operation affects the principles of the invention in no significant way. To illustrate this, the embodiment of FIG. 4 is an encoder which is similar to the embodiment of FIG. 3 but with the addition of polarity switching apparatus. To facilitate operation of the polarity switching apparatus, the analog input samples are initially placed on the prior state storage capacitor (capacitor 311 in FIG. 3) and the comparison circuit operates by comparing $e_d$ with a predetermined datum level. The circulating operation of the encoder, including the redistributing capacitors 1 and 2, the summing amplifier 420, storage capacitors 414 and 411, and isolating buffer 416, is the same as was the operation of the encoder of FIG. 3. Here, however, the reference voltage source which initially charges the redistribution capacitors is a dual-polarity source 41; the first decision by the decision circuit 42, operating in conjunction with logic circuitry 43 and a digit one-polarity register 44, determined which polarity of voltage source 41 will be connected to capacitor 1. Thus, in sequence, the analog input voltage is placed on capacitor 411, summing amplifier 420 adds it to the voltage on capacitor 1 (which is initially grounded) and places the sum, which is the analog sample voltage, on capacitor 414. This voltage is transmitted by the buffer 416 as a comparison voltage, $e_d$, to the decision circuit 42. The decision circuit then causes the single pole, double throw switch 45 to be switched to the source of the proper polarity and causes switch 419 to be closed or opened, depending upon the result of the comparison. Thereafter, redistribution between capacitors 1 and 2 is commenced and the circulating encoding procedure continues in a manner similar to that previously described.

Figure 5:
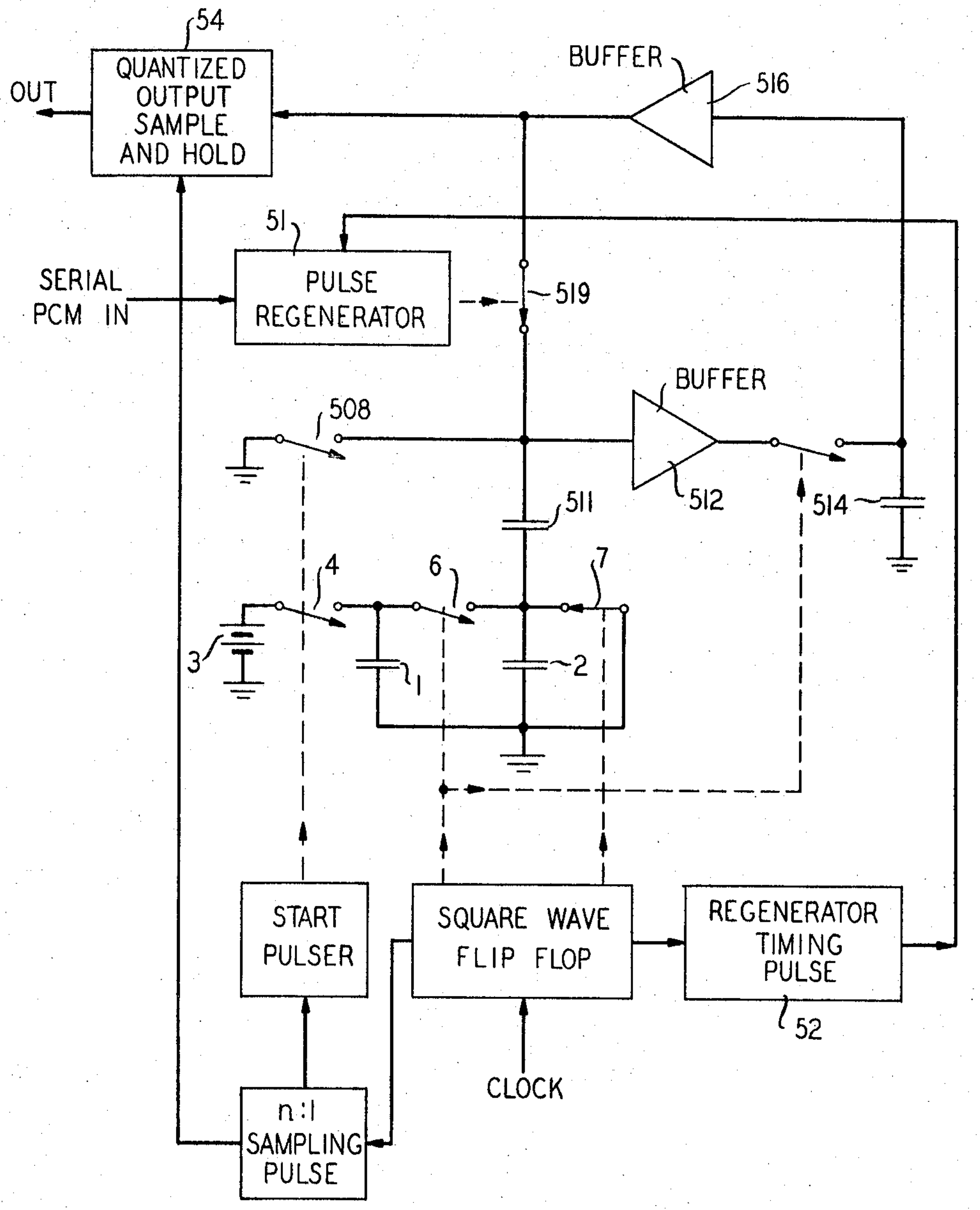
FIG. 5 shows a first illustrative embodiment of a digital to analog converter which utilizes the principles of the invention.
Figure 6:
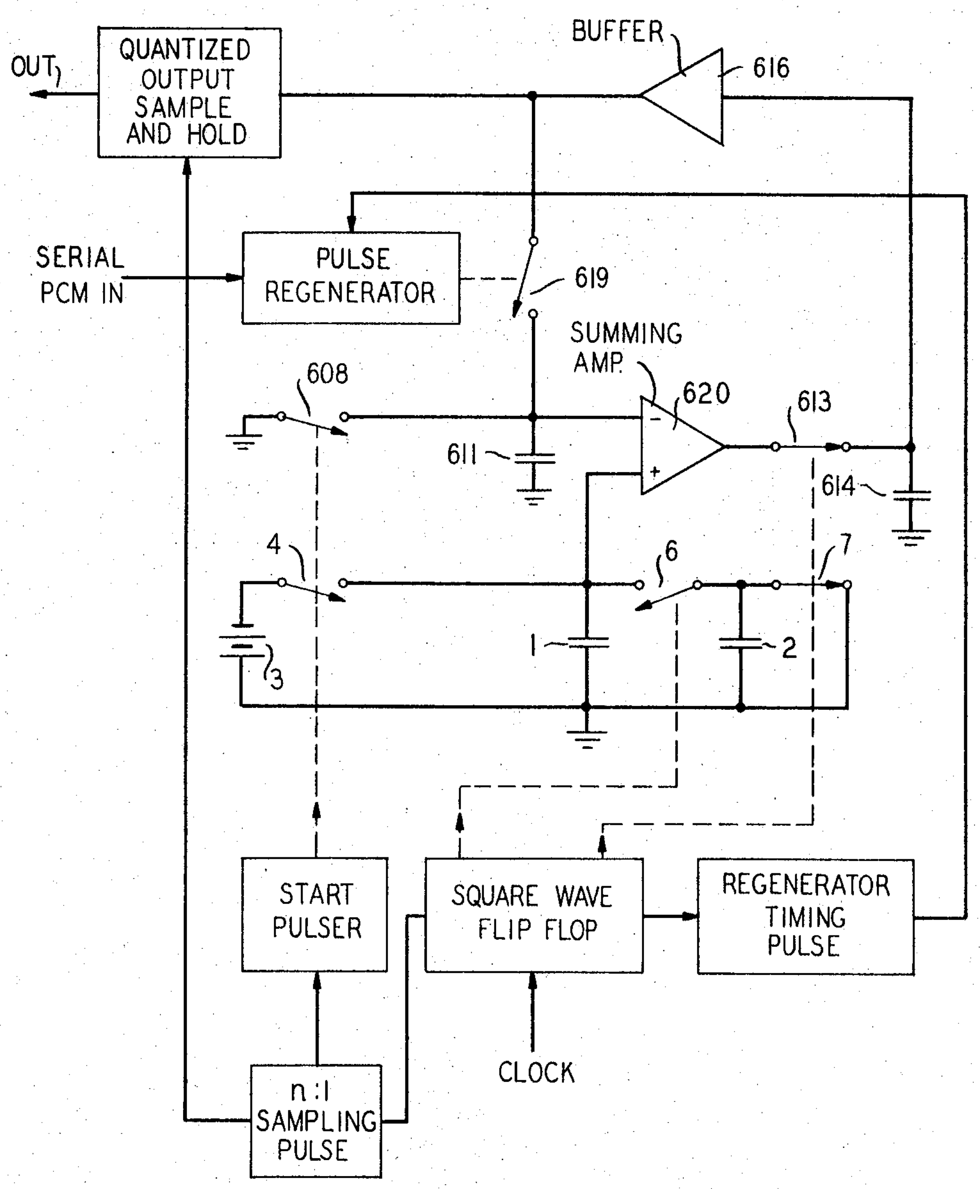
FIG. 6 shows a second illustrative embodiment of a PCM decoder which operates according to the principles of the invention.

Heretofore, the discussion has concerned itself only with analog to digital PCM encoders which use the principles of the invention. The invention, however, may be applied equally well to digital to analog PCM converters. Two decoders which embody the principles of the invention are shown in FIGS. 5 and 6. The decoder of FIG. 5 is rather similar in structure to the encoder of FIG. 2, and the decoder of FIG. 6 is similar to the encoder of FIG. 3. The operation of both decoders is quite analogous to the operation of their corresponding encoders.

The digital to analog converter depicted in FIG. 5 utilizes the same redistribution procedure which the various encoders employed and relies upon bootstrapping for accumulation and adding of charge. The operation proceeds as follows. Capacitors 1 and 2, in conjunction with switches 4, 6, and 7 and reference voltage source 3, perform the redistribution process as described in FIG. 1. The switches here are timed similarly. In the decoder, however, serial PCM digits are received by a pulse regenerator 51 which directly operates switch 519. Whenever a regenerator timing pulse from the regenerator timing pulser 52 is received by the pulse regenerator 51, switch 519 is opened or closed, depending upon whether the most recent PCM digit was a zero or a one. If switch 519 is closed, it occurs whenever switch 7 is closed, and capacitor 511 is thus charged to the voltage previously stored on capacitor 514. In the next cycle, redistribution between capacitors 1 and 2 occurs and the redistributed voltage stored on capacitor 2 raises both terminals of capacitor 511 by the bootstrap process previously described. The input to buffer 512 is therefore the voltage on the capacitors 2 and 511. Capacitor 514 is charged to this summed voltage by the buffer 512, and buffer 516 in turn transmits this voltage to the top of switch 519. This loop process is continued sequentially for the *n* digits of the PCM input word. Then, the quantized output sample-and-hold circuit 54 is activated by a control pulse, enabling it to take the accumulated voltage on capacitor 514 for the analog output sample voltage. Then, all capacitors are discharged, capacitor 1 is recharged to the reference voltage, and a new coding sequence begins.

The embodiment of FIG. 6 operates in a similar fashion. However, the buffer 12 and the bootstrapping configuration of capacitors 2 and 511 have been replaced with a summing amplifier 620, and capacitor 611 has been connected to ground. Thus, instead of using bootstrapping to add the prior state stored voltage on capacitor 611 to the redistribution voltage on capacitor 1, the addition is accomplished by means of the summing amplifier 620. Capacitor 614 is thereby charged to the sum of the voltages on capacitors 1 and 611. The circulating coding sequence of FIG. 6 is the same as that of FIG. 5 with respect to the remainder of the components and the timing and operation thereof.

Both embodiments of decoders according to the invention were designated for signals of one polarity only. Their adaptation to dual polarity operation, however, is straightforward and affects their operation in no significant way.

In the embodiments of both the coder and decoder heretofore described, reference voltage 3 or 41 is shown as a fixed DC voltage. This voltage is normally selected so that only the very largest samples exceed the maximum quantum level more than a very small percentage of the time. Large samples have available to them the full range of quantum levels. Smaller samples do not use the full range and their signals are, therefore, subject to more quantizing distortion. Automatic means of adjusting the DC reference voltage at the coder may be provided to permit the quantum level range to more nearly match the signal level of an individual talker. To this end, the reference voltage $V_r$ can be made variable under the control of a peak amplitude sensing circuit.

Figure 7A:
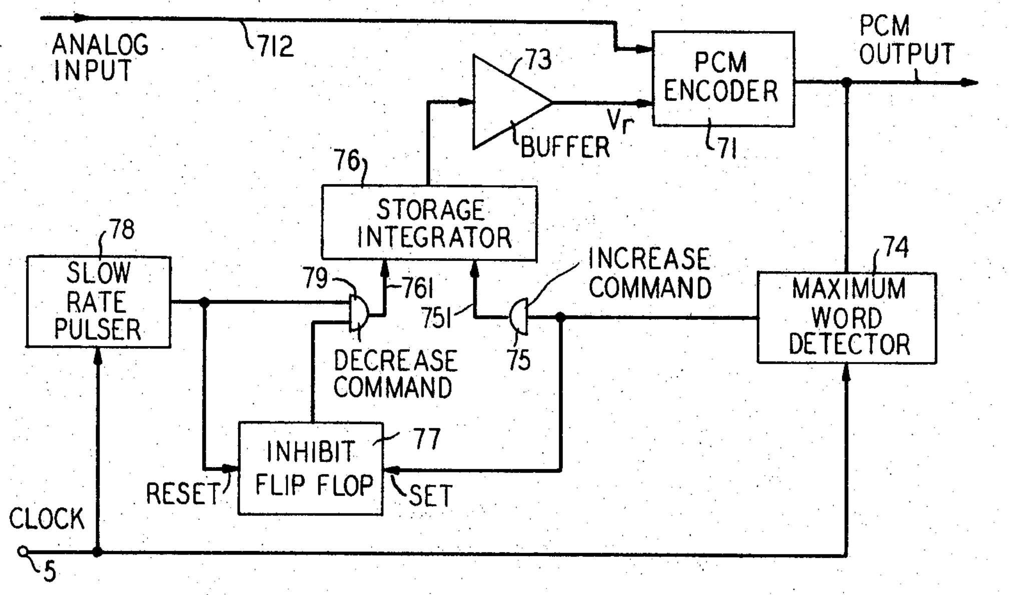
FIGS. 7A and 7B show a block diagram of an automatic scaling apparatus for PCM encoders according to the invention.

One illustrative embodiment of an automatic scaling means is shown in FIG. 7A in block diagram form. Encoder 71 may be any one of the hereinbefore described coders with an analog input signal on lead 712 and a variable reference voltage from buffer 73. The PCM output words on lead 714 are also applied to maximum word detector 74. This detector may be any of the well-known means for detecting a selected combination of binary states. Detector 74 is arranged to recognize the generation of the code word representing the maximum quantum level. For symmetric coders the maximum word detector 74 recognizes the codes representing the absolute maximum and disregards the polarity bit.

The maximum word will be generated only when the sample of the analog input signal is greater than the reference voltage ($V_r$) on lead 713. This condition of a maximum word being generated indicates that the reference voltage should be increased. The output of detector 74 causes increase command circuit 75 to operate and this in turn causes an increased voltage increment to appear on storage integrator 76 via lead 751. Buffer 73 applies the resulting increased reference voltage to the coder 71. Thus, whenever the analog voltage happens to exceed the reference voltage, the resulting maximum word will cause additional incremental increases in the reference voltage until such time as the reference voltage has been increased to a value which is greater than any analog sample. This ability of the circuit to increase the reference voltage at a rate comparable to the buildup time of the input signal results in a syllabic compandor characteristic which is commonly known as "fast attack."

The commonly accepted decrease characteristic is described as "slow decay." In order to permit the compandor to bridge short low-level intervals without substantial changes in the operating range, this rate of decrease is generally less than the rate of increase.

Gated control of the decrease increment provides for shaping the attack and decay characteristics. Blocks 77, 78, and 79 of FIG. 7A illustrate one embodiment of this type. Slow rate pulser 78 generates an output at some arbitrary rate appropriate to the class of signals to be transmitted. A convenient rate for speech signals might be 10 pulses per second corresponding to a 100-millisecond spacing. Slow rate pulser 78 resets inhibit flip-flop 77 on the trailing edge of the pulse; thus, inhibit flip-flop 77 is normally reset. Decrease command block 79 is thereby enabled, and a decrease command is generated for each pulse from slow rate pulser 78. The decrease command applied to storage integrator 76 by way of lead 791 causes the reference voltage to be decreased by one increment value. This resulting decrease is applied by buffer 73 to coder 71. The reduction in $V_r$ thus established sets a smaller range for the $2^n$ quantum levels of coder 71; so each quantum step is correspondingly reduced.

Decrease command block 79 continues to cause incremental decreases in the reference voltage until such time as the reference voltage falls below the peak input signal. When this level is reached, coder 71 will code some sample as a maximum word. Maximum word detector 74 will then operate to cause an increase increment to occur as heretofore described, and in addition detector 74 will set inhibit flip-flop 77. Flip-flop 77 inhibits the decrease command block 79 and thus prevents the next pulse from slow rate pulse 78 from causing a decrease command to be generated. Pulser 78 resets inhibit flip-flop 77; so subsequent decrease commands can be generated unless maximum word detector 74 operates in the intervening interval.

This arrangement permits only increase increments to be generated during an interval when the peak input signal is too high. Only decrease signals are generated when the reference voltage is too high. Ideally this would generate alternate increase and decrease pulses at the rate of slow rate pulser 78 when the peak signal and reference voltage are alike.

Figure 7B:
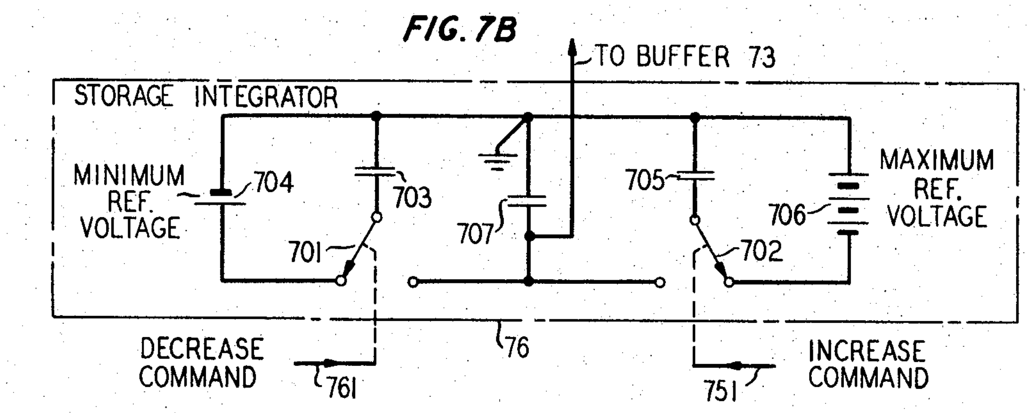

One method of setting both upper and lower bounds on the reference voltage is illustrated by the storage integrator 76 shown in FIG. 7B. This embodiment uses techniques which are related to those used in the charge redistribution coder.

In FIG. 7B switches 701 and 702 are normally closed as shown. Capacitor 703 is thus normally held charged to the voltage of minimum reference voltage source 704, while capacitor 705 is held charged to the voltage of maximum reference voltage source 706. Storage capacitor 707 is thus isolated except for the high-input impedance of buffer 73. The output of this buffer is the reference voltage for a unipolar operation. For bipolar operation, a phase-splitting operational amplifier with zero offset, for example, might be employed.

When an increase command appears on lead 751, switch 702 is reversed, thus causing a redistribution of the charge between capacitors 705 and 707. To keep any incremental change small with respect to the total range, capacitor 707 should be much larger than capacitors 703 and 705. If capacitor 707 is an integer multiple $k$ of capacitors 703 and 705 ($C_{707}=aC_{705}=kC_{703}$), $V_{j-1}$ is the voltage stored on capacitor 707 just prior to the $j$th closure of either of switches 701 or 702 and $V_s$ is the battery voltage to which the related capacitor 703 or 705 is charged, the voltage difference between the two capacitors to be joined briefly is $V_s-V_{j-1}$. The resulting change in voltage $$\Delta V_r=(V_b-V_{j-1})/(k+1)$$

and the new reference voltage stored on capacitor C1 is $$V_r=V_{j-1}+\Delta V_r$$

where $V_r$ is the reference voltage to buffer 73. This results in an exponential charging characteristic which has the advantage of permitting a relatively large change towards the midvalue when the reference voltage is near one of the extremes while at the same time limiting any further movement away from the midvalue to a relatively smaller change. This permits a faster response to changes in signal level.

A long run of decrease commands causes the voltage stored on capacitor 707 to approach closely to the minimum reference voltage while redistribution due to a long run of increase commands raises the voltage stored on capacitor 707 essentially to the maximum reference voltage 706.

The automatic scaling arrangement being described does not require the transmission of any separate control information over the transmission path. The receiver can accurately track the coder and thus reproduce at the decoder output the equivalent original talker volumes with all talkers using essentially the full set of quantum levels.

The maximum word code serves to control the operation of the syllabic expandor at the decoding terminal. For convenience and precise tracking the slow rate pulser should be synchronized with the corresponding pulser at the transmitter. This may be conveniently accomplished by simple counting dividers.

Figure 8:
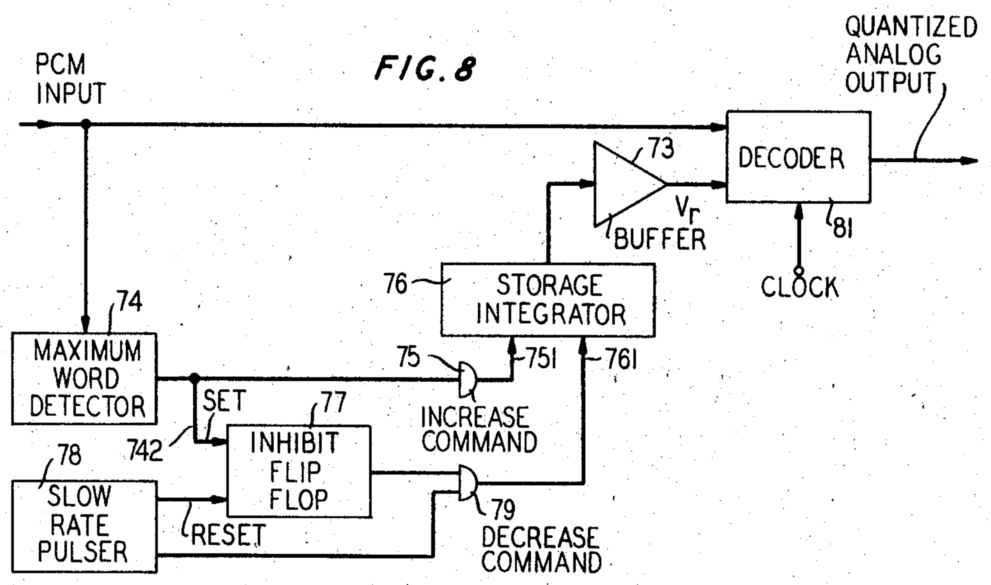
FIG. 8 shows a block diagram of an automatic scaling apparatus for PCM decoders according to the invention.

FIG. 8 illustrates one embodiment of such an automatic scaling circuit in block diagram form. All of the circuits are the same as those shown in FIG. 7A except that decoder 81 replaces coder 71 and maximum word detector 74 is connected to PCM input bus rather than the PCM output bus.

Every time a maximum word is recognized an increase command will be generated as before with a corresponding increase in the quantized output range of the analog signal. In the absence of any increase command, the slow rate pulser will initiate a decrease command. This reduces the output range in the same way it was reduced at the coder. The reference voltages at the two terminals will track. If the limiting voltages $V_{min}$ and $V_{max}$ are not the same at both terminals, just an average volume change will result which is proportional to the difference in limiting voltage between the terminals.

Because of the similarity of the coders and decoders as illustrated by FIG. 2A and FIG. 5 and also by FIG. 3A and FIG. 6 it is apparent that one circuit can be made to perform both the coding and decoding functions. During the coding part of the operation, comparator 17 is permitted to control switch 19 of FIG. 2A, or switch 319 of FIG. 3A. During the decoding part of the operation, pulse regenerator 51 controls the same switch or an equivalent parallel switch.

The illustrative embodiments of the invention as described herein were intended to show the principles of the invention. Numerous other embodiments of these principles may occur to workers skilled in the art without departure from the spirit and scope of the invention.

What is claimed is:

1. In a system which utilizes analog-type signals coded as digital-type signals comprising binary words, each word being associated with an analog sample and each digit of a binary word being associated with a quantizing level of the coded analog sample, apparatus for converting signals of one type to corresponding signals of the other type comprising:

a source of timing pulses;

a reference voltage source;

first, second, third, and fourth capacitors;

means for charging said first capacitor to the reference voltage;

means, under the control of the timing pulses, establishing a step voltage waveform by periodically coupling together said first and second capacitors allowing charge to be redistributed therebetween, said second capacitor being discharged prior to each of said couplings;

means for sequentially applying a voltage to said third capacitor which equals the sum of the voltage on said fourth capacitor and the voltage of said step voltage waveform;

means responsive to the voltage on said third capacitor for developing an output signal; and means for charging said fourth capacitor to the voltage on said third capacitor upon occurrence of a digital signal pulse.

2. A signal converter as claimed in claim 1 wherein said means for sequentially applying a voltage to said third capacitor comprises a summing amplifier, the voltages of said step voltage waveform and on said fourth capacitor being added by said amplifier and the sum being placed on said third capacitor.

3. A signal converter as claimed in claim 1 wherein said means for sequentially applying a voltage to said third capacitor comprises said second and fourth capacitors and buffering means, said fourth capacitor being series connected with said second capacitor and said buffering means being connected between said fourth and said third capacitors.

4. A signal converter as defined in claim 1 wherein said converter is an analog to digital converter and said means for developing an output signal includes means for emitting a digital signal pulse whenever the voltage on said third capacitor is less than or equal to the analog sample voltage.

5. A signal converter as defined in claim 1 wherein said converter is a digital to analog converter and said means for developing an output signal includes means for sampling the voltage on said third capacitor.

6. In a system which utilizes analog-type signals coded as digital-type signals comprising binary words, each word being associated with an analog sample and each digit of a binary word being associated with a quantizing level of the coded analog sample, means for converting signals of one type to corresponding signals of the other type comprising:

a source of timing pulses;

first, second, and third, and fourth capacitors and means for discharging them;

control pulsing means, responsive to the timing pulses, for generating and transmitting control pulses at a specified rate;

a reference voltage source including fifth, sixth, and seventh capacitors, a minimum and a maximum steady state voltage supply, switching means, responsive to indicating pulses, for connecting said sixth capacitor between said maximum steady state voltage supply and said fifth capacitor, switching means responsive to control pulses from said control pulsing means for connecting said seventh capacitor between said minimum steady state voltage supply and said fifth capacitor, said means for charging said first capacitor to the reference voltage including buffering means connected at its input to said fifth capacitor and at its output by said switching means to said first capacitor;

means for charging said first capacitor to the reference voltage;

means under the control of the timing pulses for applying to said second capacitor successively diminishing increments of the voltage on said first capacitor, preceding increments being discharged to ground by said discharging means before succeeding increments are applied;

means for sequentially applying to said third capacitor the sum of the voltage on said fourth capacitor and the voltage on said first capacitor;

means for charging said fourth capacitor to the voltage on said third capacitor upon occurrence of a digital signal pulse;

and means, under the control of the timing pulses and responsive to the digital signals, for varying the reference voltage in accordance with the analog sample sizes including means under the control of the timing pulses for detecting a maximum binary word corresponding to the largest analog sample to be encoded, means responsive to said detecting means for signaling the detection of the maximum binary word to said reference voltage source by means of indicating pulses, said control pulsing means, and means, responsive to the indicating pulses for inhibiting the transmission of control pulses from said control pulsing means to said reference voltage source, said reference voltage source generating a reduced reference voltage upon receipt of control pulses and generating an increased reference voltage upon the receipt of indicating pulses.

* * * * *